(12) United States Patent
Kukowski

(10) Patent No.: US 8,796,547 B2
(45) Date of Patent: Aug. 5, 2014

(54) ELASTOMERIC CONDUCTOR AND SHIELD FAULT DETECTION

(75) Inventor: Thomas R. Kukowski, Apple Valley, MN (US)

(73) Assignee: Minnesota Wire and Cable, St Paul, MN (US)

( * ) Notice: Subject to any disclaimer, the term of this patent is extended or adjusted under 35 U.S.C. 154(b) by 0 days.

(21) Appl. No.: 13/222,948

(22) Filed: Aug. 31, 2011

(65) Prior Publication Data

US 2011/0309845 A1    Dec. 22, 2011

Related U.S. Application Data

(63) Continuation of application No. 12/351,613, filed on Jan. 9, 2009, now Pat. No. 8,099,254.

(60) Provisional application No. 61/020,623, filed on Jan. 11, 2008.

(51) Int. Cl.
*H01B 7/00* (2006.01)

(52) U.S. Cl.
USPC .......................................................... 174/28

(58) Field of Classification Search
USPC .... 174/36, 102 R, 108, 110 R, 113 R, 120 R, 174/120 SR
See application file for complete search history.

(56) References Cited

U.S. PATENT DOCUMENTS

| | | | |
|---|---|---|---|
| 3,048,078 A * | 8/1962 | Kaplan et al. ........................ | 87/1 |
| 2002/0127169 A1* | 9/2002 | Smalley et al. ............. | 423/447.1 |
| 2004/0020681 A1* | 2/2004 | Hjortstam et al. ....... | 174/102 SC |
| 2006/0167139 A1* | 7/2006 | Nelson et al. .................. | 523/212 |
| 2008/0251274 A1* | 10/2008 | Lee et al. .................. | 174/113 R |
| 2008/0254675 A1* | 10/2008 | Lee et al. ....................... | 439/578 |
| 2009/0314510 A1* | 12/2009 | Kukowski et al. .............. | 174/69 |
| 2010/0036035 A1* | 2/2010 | Nelson et al. .................. | 524/433 |

* cited by examiner

*Primary Examiner* — William H Mayo, III
(74) *Attorney, Agent, or Firm* — Duft Borsen & Fetting LLP

(57) ABSTRACT

Systems and methods are provided for early detection of wire/cable faults. For example, a system may detect electrical/electronic faults with power lines, data lines, communication lines, coaxial cables, and the like (generally referred to herein as "lines", "wires", and "cables") by providing sacrificial materials including a conductive material external to the lines. A processor may be coupled to the conductive material to transmit a control signal along the conductive material of the line to determine whether the line is degrading. That is, when the sacrificial material wears away and exposes the conductive sacrificial material in the line, that conductive material may begin to experience faults. The faults in the external conductive material may serve as precursors to the overall degradation of the line. Thus, the line may be repaired or replaced prior to the degradation of the line itself.

23 Claims, 3 Drawing Sheets

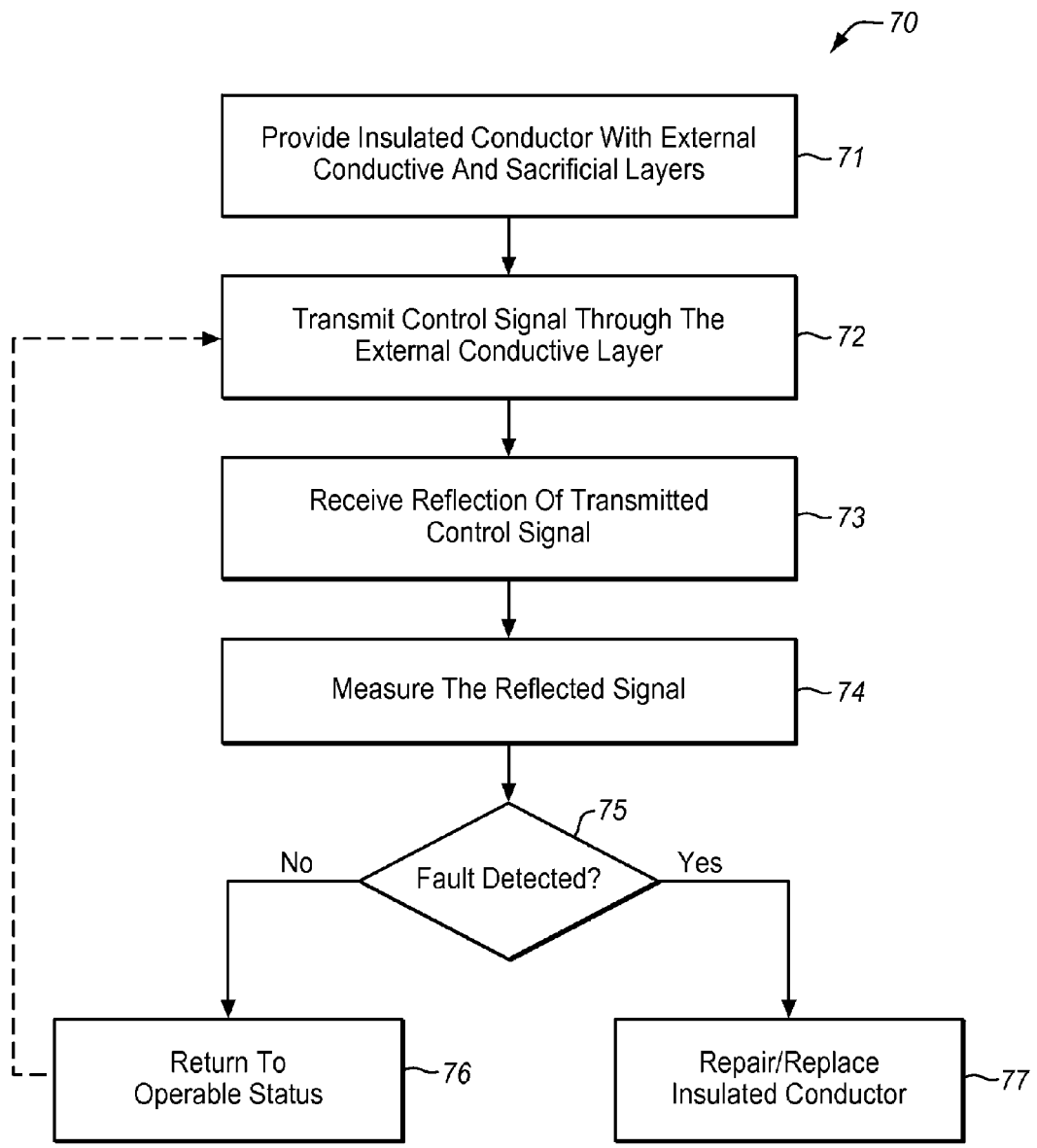

ELASTOMERIC CONDUCTOR AND SHIELD FAULT DETECTION

CROSS REFERENCE TO RELATED APPLICATIONS

This patent application is a continuation patent application claiming priority to and thus the benefit of an earlier filing date from U.S. patent application Ser. No. 12/351,613 (filed Jan. 9, 2009), and patented as U.S. Pat. No. 8,099,254, which claims priority to and thus the benefit of an earlier filing date from U.S. Provisional Patent Application No. 61/020,623 (filed Jan. 11, 2008), the entire contents of each of which are incorporated by reference.

BACKGROUND

Electrical wiring is used to conduct electrical current in a variety of applications. For example, electrical wiring is used to conduct electrical energy for the purposes of power delivery. Electrical wiring is also used in data transmissions between electronics devices. Exceptionally important applications include the various power and data delivery uses in human related services, such as transportation (e.g., plane, automobile, etc.) and medical care.

Over time, wiring can deteriorate due to environmental conditions and ultimately degrade wire integrity. For example, excessive flex, chafing between adjacent wires, lack of strain relief, altitude, temperature, humidity, and/or acceleration can jeopardize the integrity of the wire. When a wire breaks, open circuit conditions are created that contribute to a loss of signal integrity, component failures, or even catastrophic fires. Due to the intermittent nature of most of cable failures, these problems are often difficult to detect and more difficult to repair.

Hard faults (i.e., those fault where a wire has completely failed) are quickly detected using common circuit testing equipment. Intermittent faults, however, are much more difficult to detect because the faults are generally only detectable when the wire is live (e.g., operational). Time domain reflectometry can detect intermittent events in live wires by monitoring the wire over a period of time. For example, a time domain reflectometer (TDR) may transmit a relatively short rise time pulse along a conductor. If the conductor is of a uniform impedance and properly terminated, the entire transmitted pulse is absorbed in the far-end termination. Thus, no signal is reflected towards the time domain reflectometer. Impedance discontinuities in the wire, however, cause a portion of the incident signal to be reflected back towards the source. The intermittent fault and even the location of the fault may be determined from the reflected signal. Accordingly, if the faulty wire is monitored over some period of time with the time domain reflectometer, a fault in the wire is likely to be detected by the time domain reflectometer.

Detection of wire faults is possible after the fault occurs. However, detection after the fact may be too late. For example, an aircraft with aging deteriorating wires may begin to experience intermittent faults in the wiring. TDR testing of the wires may be performed as part of maintenance on the aircraft while the aircraft is not in-flight to repair/replace faulty wires. But, intermittent faults are likely to occur while the aircraft is in flight, jeopardizing the safety of the people on board.

SUMMARY

The systems and methods described herein provide for the early detection of wire/cable faults. For example, the systems and methods described herein may detect electrical/electronic faults with power lines, data lines, communication lines, coaxial cables, and the like (generally referred to herein as "lines", "wires", and "cables") by providing a sacrificial materials including a conductive material external to the lines. A processor may be coupled to the conductive material to transmit a control signal along the conductive material of the line to determine whether the line is degrading. That is, when the sacrificial material wears away and exposes the conductive sacrificial material in the line, that conductive material may begin to experience faults. The faults in the external conductive material may serve as precursors to the overall degradation of the line. Thus, the line may be repaired or replaced prior to the degradation of the line itself.

In one embodiment, a system for determining line integrity includes an insulated line that includes a conductive material surrounding the insulation of the insulated line. The insulated line further includes a sacrificial material surrounding the conductive material. The insulated line also includes a processor (e.g., a time domain reflectometer) operable to communicatively couple to the conductive material to determine integrity of the insulated line.

The sacrificial material may be configured from Teflon or another suitable material. The conductive material may be configured from a metallic ink, a nanoparticulate material (e.g., carbon nanotubes). The processor may be configured to determine degradation of the sacrificial material via the conductive material. The insulated line may include an elastic primary configured from a nano particulate material. The conductive material may have a thickness less than about 100 nm.

In another embodiment, a method of determining line integrity may include providing an insulated line. The insulated line includes a conductive material surrounding the insulation of the insulated line and a sacrificial material surrounding the conductive material. The method may also include coupling to the conductive material of the insulated line, transmitting a control signal along the conductive material, and measuring an electrical characteristic of the control signal to determine the line integrity. For example, measuring the electrical characteristic includes determining voltage changes in the control signal from a point where the control signal is transmitted to the conductive material. The method further including determining integrity of the sacrificial layer based on the electrical characteristic of the control signal. Coupling to the conductive material may include coupling a time domain reflectometer to the conductive material.

In another embodiment, a system for determining line integrity includes a coaxial cable that includes a primary, a dielectric material, a shielding, and an insulator. The coaxial cable further includes a conductive material surrounding the insulator and a sacrificial material surrounding the conductive material. The system also includes a processor operable to communicatively couple to the conductive material to determine integrity of the insulated line.

BRIEF DESCRIPTION OF THE DRAWINGS

The same reference number represents the same element or same type of element on all drawings.

FIG. 4 is a flowchart of a process for detecting line faults.

DETAILED DESCRIPTION OF THE DRAWINGS

Figure 1:
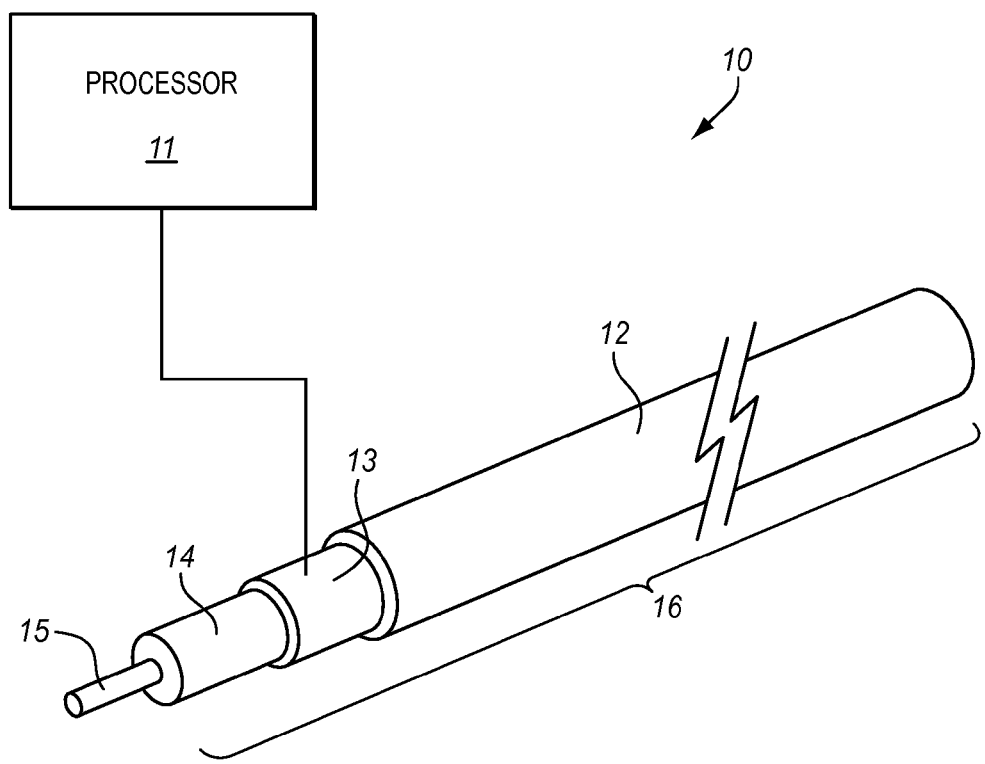
FIG. 1 is a system that provides for the early detection of line faults.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as recited in the claims.

FIG. 1 is a perspective cut away view of a system 10 that provides for the early detection of line faults. The system 10 includes a processor 11 and a line 16. The line 16 may be configured in a variety of ways based on the particular need of the line 16. For example, the line 16 may be an insulated wire for use in a twisted-pair configuration, a coaxial cable for use in communications, an elastic wire/cable, etc. In this regard, the line 16 may be configured with a conductive primary 15 and an insulator 14. Differing from previous configurations, the line 16 includes a conductive material 13 surrounding the insulator 14 and an insulating sacrificial material 12 surrounding the conductive material 13. For example, the conductive material 13 may be configured from a nano particulate material that is conductive, such as that disclosed in commonly owned and co pending U.S. patent application Ser. No. 12/351,463 (filed Jan. 9, 2009; the "'463 application"), the entire contents of which are incorporated within by reference. Alternatively, the conductor 13 may be configured of traditional metal wire. This conductive material 13 may be substantially thin (e.g., less than about 100 nm) so as to not add significantly to the overall weight of the line 16. The conductive material 13 may be used to detect faults in the line 16 prior to the faults affecting the conductive primary 15.

The sacrificial material 12 may also be configured from relatively lightweight materials, such as Teflon tape, that provides some protection for the conductive material 13. For example, degradation of a wire over time generally occurs due to conditions that are external to the line 16. In other words, chafing, environmental conditions, chemicals, and the like, tend to wear away the wire from the outside in. Eventually, these conditions affect the integrity of the conductive material within the wire and ultimately create faults within the wire. To detect these faults prior to failure, the line 16 is surrounded by the conductive material 13 and the sacrificial material 12. The degradation of the line 16 may therefore be detected by the processor 11 before the primary 15 is affected.

In one embodiment, conductive material 13 may be configured from a metallic "ink" such as that produced by Cima Nanotech, Inc., of St. Paul, Minn. In such an embodiment, the metallic ink may be coated on the insulating material 14 like a paint. The sacrificial material 12 may then be wrapped about the metallic ink to provide a certain level of protection. After some period of time, the sacrificial material 12 may begin to experience the same effects of degradation common to traditional lines. For example, chafing, environmental conditions, chemicals, etc., that over time degrade traditional lines, may have the same effect of wearing away the sacrificial material 12 and exposing the conductive material 13. Once exposed, the conductive material 13 may experience similar failures seen in degrading wires. Thus, the detection of these faults within the conductive material 13 may serve as a precursor to the degradation of the overall line 16. In other words, detection of the faults within the conductive material 13 may be used to identify when and where faults may occur within the primary 15 prior to them actually happening.

As is commonly the case with traditional line integrity detection, detection of the degradation in the line 16 generally occurs after the fact. For example, the processor 11 may be a time domain reflectometer that is used to test the integrity of the line 16 after the line has been in use. The processor 11 may be coupled to the conductive material 13 to propagate a pulse down the line 16 and, when the far end of the line 16 is shorted (i.e., terminated into zero ohms impedance), the voltage at the launching point of the pulse steps up to a given value instantly and the pulse begins propagating down the line 16 towards the short. When the pulse hits the short, the energy is not absorbed at the far end of the line 16. Rather, the pulse reflects from the short towards the launching end. When the opposing reflection finally reaches the launch point, the voltage at the launching point abruptly drops to zero signaling that there is a short at the end of the line 16. In other words, the TDR has no indication that a short exists until the pulse travels along the line 16 at roughly the speed of light and echoes back at the same speed. Assuming the signal propagation speed in the line 16 is known, the distance to the short can then be measured.

A similar effect occurs if the far end of the line 16 is an open circuit (i.e., terminated into an infinite impedance). In this case, the reflection from the far end is polarized identically with the original pulse and adds to the pulse rather than cancelling it out. Thus, after a round-trip delay, the voltage at the TDR abruptly jumps to twice the originally applied voltage. With this in mind, time domain reflectometers may reveal growing resistance levels on joints and connectors as they corrode, and increasing insulation leakage as it degrades and absorbs moisture long before either leads to catastrophic failures. TDRs may also be used to test relatively long lines, such as those that are impractical to inspect (e.g., due to distance, location, etc) as they locate faults to within centimeters.

Although a fault in the conductive material 13 may not be detected by the processor 11 until after the fault occurs, the integrity of the line 16 is not jeopardized. For example, the fault is likely to occur in the conductive material 13 before reaching the primary 15. Thus, routine maintenance upon detection in the conductive material 13 should conclude when the line 16 is wearing away before a fault actually occurs in the line 16.

The advantages of the line 16 include a relatively lightweight manner in which the sacrificial materials may be included with the line. For example, many lines are very long, such as those employed by aircraft. In fact, an aircraft may include over 100 miles of line for various data, communication, and power needs. When metallic ink is used to coat these lines, the metallic ink adds very little to the overall weight of the line 16 as the metallic ink is on the order of a nanometers in thickness. To further illustrate, a much thicker metal foil (e.g., greater than 200 micrometers) would likely increase the overall weight of the line 16 much more significantly than the metal ink that is applied to the line 16. Similarly, the sacrificial material 12 generally adds very little to the overall weight of line 16. For example, Teflon tapes and wraps may be configured to be exceptionally thin and light weight. Such tapes may be used to protect the conductive material 13 but may also "wear away" prior to a fault in the primary 15 due to the environmental conditions to which the line 16 is exposed. The sacrificial material 12, therefore, provides a minimum layer of protection for the purposes of exposing certain line degrading conditions upon detection of the fault in the conductive material 13.

In another embodiment, the conductive material 13 is made conductive through the use of nano particulates, such as disclosed in the '463 application. For example, the conductive material 13 may be configured of carbon nanotubes that are typically lighter than conductive metals. Examples of carbon nanotubes include single walled carbon nanotubes that are generally shaped in a tube having a diameter of about 1 nanometer and a tube length that is much longer. These nanotubes exhibit similar electric properties of conductivity and electromagnetic shielding that are found in their metal counterparts. The carbon nanotubes may be configured with a lightweight material, such as spandex in a pre-polymer state. The material may then be applied to the insulating material 14 of the line 16.

While providing a relatively lightweight conductive material, the carbon nanotubes may also be made elastic by configuring the carbon nanotubes with spandex. For example, the conductive primary 15 and the insulating material 14 may be configured of similarly elastic materials to make the line 16 more resistant to strain. To illustrate, the conductive primary 15 may be configured with a substantially dense population of carbon nanotubes within a spandex fiber by mixing the carbon nanotubes while the spandex is in a prepolymer state. The dense population of carbon nanotubes may ensure that at least portions of the carbon nanotubes remain in contact with one another when the elastic conductive primary 15 is stretched. With the elastic conductive primary 15 formed, the primary may be surrounded by an insulating material that is also elastic. For example, the conductive primary 15 may be surrounded by spandex such that the conductive primary and the insulating material 14 may be extruded to form an elastic wire. Thereafter, the conductive material 13 and the sacrificial material 12 may be applied to the elastic wire to monitor the integrity of the elastic line 16 over time.

Figure 2:
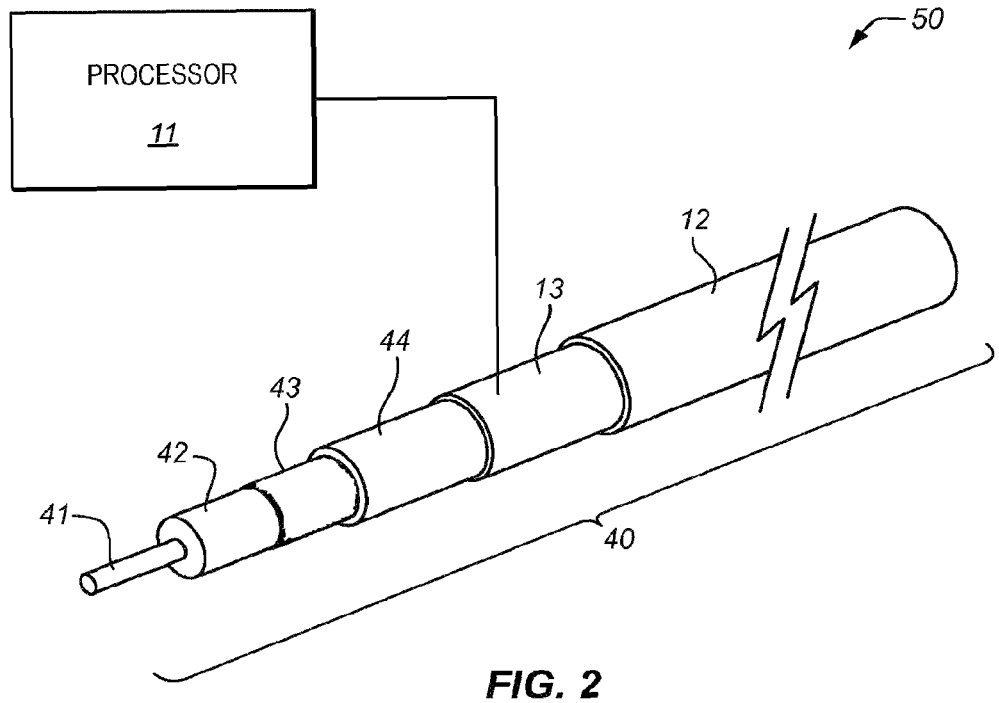
FIG. 2 is a system that provides for the early detection of coaxial cable faults.

FIG. 2 is a system 50 that provides for the early detection of coaxial cable faults. In this exemplary embodiment, a coaxial cable 40 has a typical configuration that includes a conductive primary 41, an insulating/dielectric material 42 surrounding the conductive primary 41, a shielding 43 (e.g., braided metal or nano particulate as described in the '463 application) surrounding the material 42 further surrounded by an insulating layer 44. Differing from a typical configuration of a coaxial cable, are the conductive and insulating layers 13 and 12, respectively. For example, a coaxial cable 40 may be coated with a conductive material 13 to serve as a precursor for degradation in the coaxial cable. In this regard, a processor 11 may be coupled to the conductive material 13 to transmit a control signal to the conductive material 13 and determine a breach in the sacrificial material 12.

The sacrificial material 12 may be configured of a relatively thin and light weight material that is susceptible to "wear and tear" from chafing and/or environmental conditions. The sacrificial material 12 may, therefore, degrade over time and expose the conductive material 13. The processor 11, by conducting a control signal to the conductive material 13, may detect degradations in the conductive material 13. For example, the processor 11 may include a TDR that measures the voltage of the control signal and its reflections to determine the conductivity of the conductive material 13.

Although the wires and cables shown and described herein are illustrated with the conductive material 13 completely surrounding the insulation, the invention is not intended to be so limited. For example, the conductive material 13 may be implemented as "strands" of conductive material that are configured about the length of a wire/cable. In this regard, the processor 11 described herein may be used to transmit a control signal along each strand of the conductive material. By doing so, the processor 11 may be more apt to identify specific locations at which degradation occurs along the length of the wire/cable. In other words, when the protective sacrificial material 12 is breached at some point along the wire/cable, the breach may affect a single strand of conductive material 13 while not affecting other strands of the conductive material 13. Thus, by using TDR, the processor 11 may identify the breached strand of conductive material 13 as well as the location of the breach even though other strands along the wire/cable show no signs of wear and tear.

Moreover, the processor 11 is generally illustrated being coupled to the conductive material 13 any point along the length of the wire or cable. However, the invention is not intended to be so limited. For example, the processor 11 may be configured, at least in part, as an integrated circuit that is operable within a connector that is used to couple the wire/cable to another device. In this regard, the processor 11 may receive power from a "pin" in the connector and operate as described herein. Accordingly, the processor 11 may be operable determine faults in the wired/cable in real time.

Figure 3:
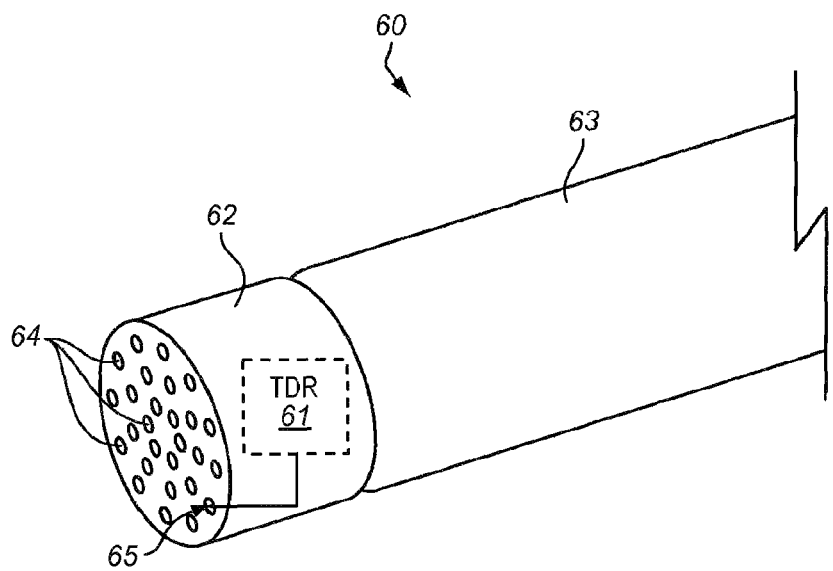
FIG. 3 illustrates a connector employing a TDR module for detecting wire/cable faults.

To illustrate, a TDR module 61 may be configured with a connector 62 as illustrated in FIG. 3. The TDR module 61 may receive power from one of the pins 64 to generate a control signal that is propagated along the length of the wire/cable 63. More particularly, the TDR module 61 may transmit a control signal along the conductive material (e.g. the conductive material 13 described above) within the wire/cable 63 to determine faults within the wire/cable 63. Since the TDR module 61 is configured with a connector 62, the TDR module 61 may be operable to convey information regarding a detected fault (e.g., via the pin 65) to a system in which the connector 62 is attached. Alternatively, the pin 65 may be coupled directly to the conductive material 13 so as to couple the conductive material to an external TDR module.

By having this real time monitoring of faults within the wire/cable 63, the faults may be quickly addressed so as to avoid catastrophic failures of the wire/cable 63. Moreover, the wire/cable 63 may be continually monitored in real time so as to maintain statistics on the wire/cable 63. For example, the processor 11 may be operable within a real-time system, such as an aircraft, that monitors a number of events. Since the processor 11 is operable to detect fault conditions within the wire/cable 63 in real time, the processor 11 may correspond certain events (e.g., storms, lightning, mechanical fault, etc.) with the fault conditions within the wire/cable 63 two further diagnose the faults in the wire/cable 63.

FIG. 4 is a flowchart of a process 70 for detecting line faults. In this embodiment, the process 70 initiates when an insulating conductor (e.g., a coaxial cable, data cable, power cable, or the like) is provided in the process element 71. The insulating conductor includes conductive and sacrificial layers external to the primary conductor of the wire/cable. These layers may serve as precursors to faults in the insulating conductor. For example, the conductive layer may be coupled to a processor to detect when the sacrificial layer has worn away and exposed the underlying conductive layer as with the conductive and sacrificial materials 13 and 12, respectively above. This wear and tear of the sacrificial layer may further expose the conductive layer to conductivity faults. In this regard, the processor may transmit a control signal through the conductive layer in the process element 72. For example, the processor may include a TDR module is used to transmit a pulse along the length of the insulated conductor via the conductive layer. The TDR module may then receive reflection of the transmitted control signal in the process element 73 and measure an electrical characteristic of the reflected signal in the process element 74. This measurement may include measuring the voltage of the reflected signal to determine whether the conductive layer is broken (i.e., open) or even shorted to an adjacent conductive material (e.g., another worn away wire/cable, a metal object, or the like).

If the fault is detected in the process element 75, an indication may be made that the insulated conductor requires repair and/or replacement in the process element 77. For example, the processor may detect a short circuit condition or an open condition that makes the insulating conductor unsafe and/or inoperable. The processor may then generate a control signal that is used to indicate the condition to maintenance personnel such that the maintenance personnel may replace or repair the insulated conductor. Such may be performed in real time and the generated data regarding the fault stored until repairs are made.

If no fault is detected in the insulated conductor, the processor may return the insulated conductor to an operable status. In other words, the processor may generate control information that is used to indicate to the maintenance personnel that the insulated conductor is presently operable and not in need of repair/replacement. Since the processor is capable of performing such fault detection in real-time, the processor may continuously loop through the process 70 by returning to the process element 72 to determine either intermittent or catastrophic faults within the insulated conductor.

In one embodiment, the insulated conductors described herein are configured to be elastic as described in the cross referenced provisional patent application and in the '463 application. Elastic electrical conductors may have a variety of advantageous uses. For example, flexible elastic wires can improve, among other things, wire and cable reliability, body worn comfort, and weight reduction. Flexible elastic wires may make the wires less susceptible to breakage and/or faults associated with intermittent conductivity. Moreover, the relatively light weight of the elastomeric fibers may reduce energy associated with transporting such cables. For example, lighter cables in the airline industry directly reduce the overall weight of an aircraft thereby reducing the expense of transporting heavier cables. The lighter weight and flexibility of the cables also provides a more effective means for wearable electronics. For example, as more electronics are integrated with clothing (e.g., a soldier's uniform), lighter weights are required so that the person may be capable of relatively unrestricted movement.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A cable, including:
   an electrically conductive wire primary;
   an insulator configured about the electrically conductive wire primary to electrically insulate the electrically conductive wire primary;
   an electrically conductive nanoparticulate material configured about the insulator and operable to couple to a time domain reflectometer to conduct a time domain reflectometry signal from the time domain reflectometer along a length of the cable to determine cable integrity based on voltage changes in the time domain reflectometry signal; and
   a sacrificial material configured about the electrically conductive nanoparticulate material and operable to protect the electrically conductive nanoparticulate material from wear.

2. The cable of claim 1, wherein the sacrificial material includes Polytetrafluoroethylene.

3. The cable of claim 1, wherein the sacrificial material includes polyimide material.

4. The cable of claim 1, wherein the electrically conductive nanoparticulate material includes metallic ink.

5. The cable of claim 1, wherein the electrically conductive nanoparticulate material includes carbon nanotubes.

6. The cable of claim 1, wherein the electrically conductive nanoparticulate material has a thickness less than about 100 nanometers.

7. The cable of claim 1, wherein the cable is a Universal Serial Bus cable.

8. A coaxial cable, including
   an electrically conductive primary;
   a dielectric material configured about the electrically conductive primary;
   an electrical insulator configured about the dielectric material;
   an electrically conductive nanoparticulate material configured about the electrical insulator and operable to couple to a time domain reflectometer to conduct a time domain reflectometry signal from the time domain reflectometer along a length of the coaxial cable to determine cable integrity based on voltage changes in the time domain reflectometry signal; and
   a sacrificial material configured about the electrically conductive nanoparticulate material and operable to protect the electrically conductive nanoparticulate material from wear.

9. The coaxial cable of claim 8, wherein the sacrificial material includes Polytetrafluoroethylene.

10. The coaxial cable of claim 8, wherein the sacrificial material includes polyimide material.

11. The coaxial cable of claim 8, wherein the electrically conductive nanoparticulate material includes metallic ink.

12. The coaxial cable of claim 8, wherein the electrically conductive nanoparticulate material includes carbon nanotubes.

13. The coaxial cable of claim 8, wherein the electrically conductive nanoparticulate material has a thickness less than about 100 nanometers.

14. An elastic cable, including:
   an elastic primary configured from an elastic material and embedded with carbon nanotubes that are operable to conduct electric current through the primary; and
   an elastic insulator configured about the elastic primary and operable to electrically insulate the elastic primary, wherein the elastic insulator has an elasticity comparable to the elastic primary, thereby providing the elastic cable with an elasticity of the elastic primary and substantially maintaining conductivity of the elastic primary when stretched.

15. The elastic cable of claim 14, further including:
   an elastic shielding configured about the elastic insulator, wherein the elastic shielding includes an electrically conductive material; and
   an elastic insulator configured about the elastic shielding, wherein the elastic shielding and the elastic insulator about the elastic shielding configure the elastic cable as an elastic coaxial cable.

16. The elastic cable of claim 15, wherein the electrically conductive material includes woven metal threads.

17. The elastic cable of claim 15, wherein the electrically conductive material includes metallic ink.

18. The elastic cable of claim 15, wherein the electrically conductive material includes conductive carbon nanotubes.

19. The elastic cable of claim 14, further including:
an electrically conductive nanoparticulate material configured about the elastic insulator and operable to couple to a time domain reflectometer and conduct a time domain reflectometry signal from the time domain reflectometer along a length of the elastic cable to determine cable integrity based on voltage changes in the time domain reflectometry signal; and
a sacrificial material configured about the electrically conductive nanoparticulate material and operable to protect the conductive nanoparticulate material from wear.

20. The elastic cable of claim 19, wherein the electrically conductive nanoparticulate material includes metallic ink.

21. The elastic cable of claim 19, wherein the electrically conductive nanoparticulate material includes carbon nanotubes.

22. The elastic cable of claim 19, wherein the electrically conductive nanoparticulate material has a thickness less than about 100 nanometers.

23. The elastic cable of claim 14, wherein the elastic cable is an elastic Universal Serial Bus cable.

* * * * *